United States Patent
Blanksby et al.

(10) Patent No.: US 6,539,367 B1
(45) Date of Patent: Mar. 25, 2003

(54) METHODS AND APPARATUS FOR DECODING OF GENERAL CODES ON PROBABILITY DEPENDENCY GRAPHS

(75) Inventors: Andrew J. Blanksby, Bradley Beach, NJ (US); Christopher John Howland, Manalapan, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/579,216

(22) Filed: May 26, 2000

(51) Int. Cl.[7] .............................................. G06F 15/18
(52) U.S. Cl. ........................................ 706/14; 714/752
(58) Field of Search .............................. 706/14, 12, 10; 714/752

(56) References Cited

PUBLICATIONS

Frank R. Kschischang, et al; Iterative Decoding of Compound Codes by Probability Propagation in Graphical Models; Feb. 1988; IEEE 0733–8716/98; 219–230.*

* cited by examiner

Primary Examiner—Wilbert L. Starks, Jr.
Assistant Examiner—Joseph P. Hirl

(74) Attorney, Agent, or Firm—Ryan, Mason & Lewis, LLP

(57) ABSTRACT

A block-parallel decoding algorithm and corresponding decoder architecture utilizes a set of interconnected processing nodes configured in the form of a probability dependency graph. The probability dependency graph is characterized at least in part by a code used to encode blocks of bits or symbols, and the processing nodes implement a block-parallel decoding process for blocks of the bits or symbols to be decoded. The probability dependency graph may be, for example, a bipartite probability dependency graph which includes a set of N variable nodes and a set of T check nodes, with one of the N variable nodes being associated with each of N bits or symbols of a given block to be decoded. A single iteration of the block-parallel decoding process produces within the variable nodes an updated estimate for every bit or symbol in the given block, and may produce within the variable nodes an a-posteriori probability associated with the decoded bit or symbol for a soft-decision decoder. As another example, the probability dependency graph may be in the form of a directional probability dependency graph with multiple levels of nodes including an initial level, at least one intermediate level and a final level, arranged such that calculations can be performed at each level without sequential intra-block dependencies. The outputs of the nodes of the final level give an estimate of the transmitted bits or symbols for the given block, and may provide an estimate of the corresponding a-posteriori probabilities for a soft-decision decoder.

68 Claims, 8 Drawing Sheets

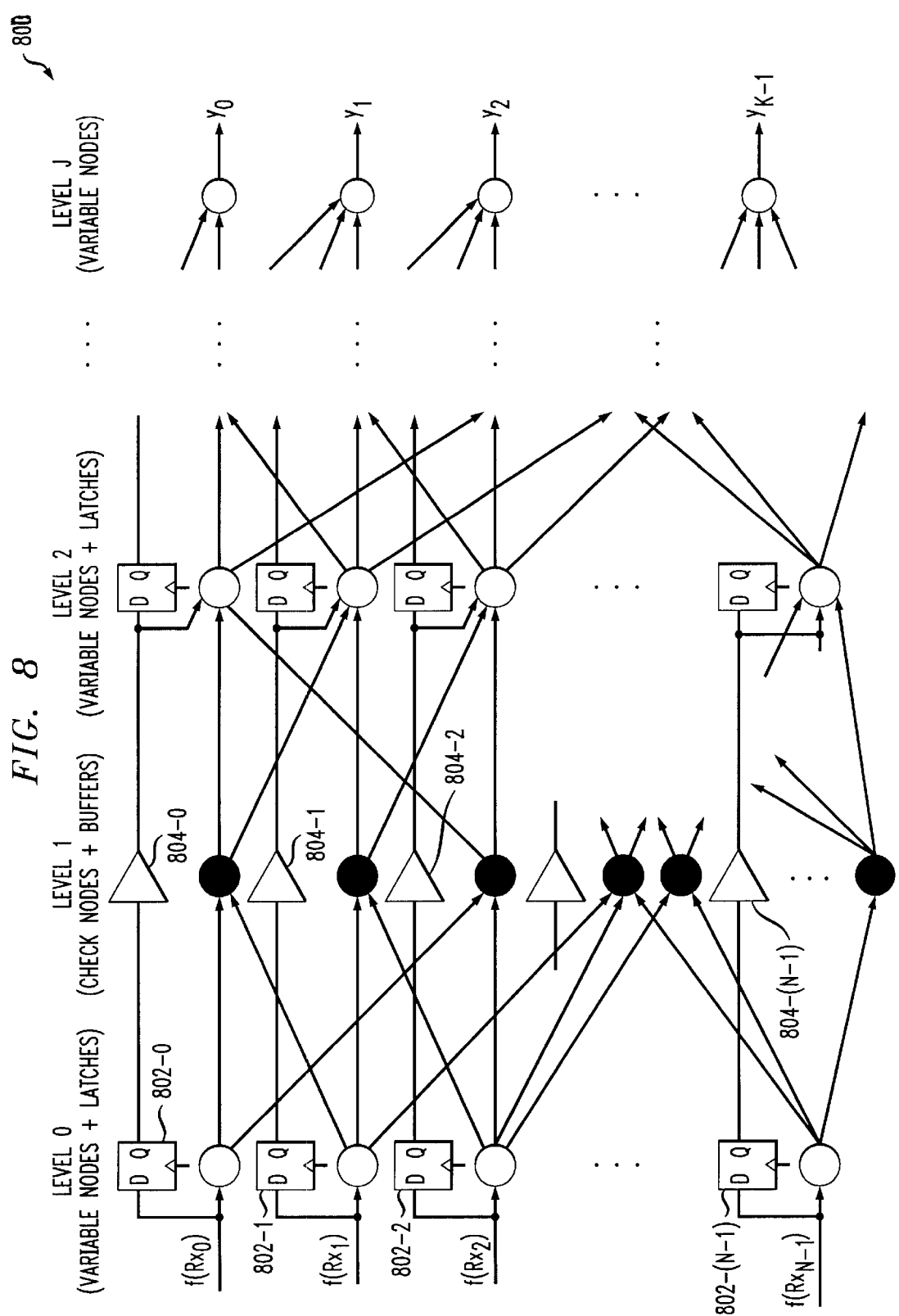

METHODS AND APPARATUS FOR DECODING OF GENERAL CODES ON PROBABILITY DEPENDENCY GRAPHS

FIELD OF THE INVENTION

The present invention relates generally to information coding and decoding techniques, and more particularly to decoder algorithms and architectures for use in decoding encoded information signals.

BACKGROUND OF THE INVENTION

Coding is widely used to decrease bit and packet error probabilities in the transmission of digital information. In many applications, convolutional codes are used for this purpose. A convolutional code is defined by a state machine with state transitions determined by the input bits to be encoded. The two most common decoding algorithms for convolutional codes or codes based on convolutional codes are the Viterbi algorithm and the maximum a-posteriori probability (MAP) algorithm.

The Viterbi algorithm is described in A. J. Viterbi, "Error bounds for convolutional codes and an asymptotically optimum decoding algorithm," IEEE Trans. Inform. Theory, Vol. IT-13, pp. 260–269, April 1967, which is incorporated by reference herein. The algorithm decodes received bits or symbols by finding the most likely path through a time-expanded state transition diagram called a trellis.

FIG. 1 shows a conventional block-serial Viterbi decoder 100. The decoder 100 includes S branch metric units (BMUs) 102, individually denoted 102-$j$, where $j=0, 1, \ldots$ S−1. A given one of the BMUs 102-$j$ has an input which receives a bit or symbol, and an output which is coupled to an input of a corresponding add-compare-select unit (ACSU) 104-$j$. The BMU 102-$j$ and ACSU 104-$j$ are also denoted $BMU_j$ and $ACSU_j$, respectively, in the figure. The outputs of the set of ACSUs 104 are applied to a survivor memory unit (SMU) 106 which generates decoded bits from the received bits or symbols. The operation of the Viterbi decoder 100 is described below. This description assumes that a given block being decoded comprises N received bits or symbols.

The decoder 100 is initialized by initializing the path metric of state 0 to be zero, $PM_0=0$, and that of all other states to infinity, $PM_{1 \ldots S-1}=\infty$. The decoding algorithm then performs the following recursive iteration which includes an outer loop which iterates on every received bit or symbol and an inner loop which iterates on every state in the trellis:

For every received bit or symbol, $Rx_i$, $i=0, 1, \ldots N-1$, in the block:

For each state in the trellis:
1. Calculate a branch metric for each branch from the current state to a possible next state. The branch metric for a given branch of the trellis is a measure of the likelihood of the transition from the current state to the state the branch connects to given the received symbol or bit $Rx_i$. The branch metric calculation is performed by the BMUs 102.
2. Perform a comparison to find the minimum path metric entering each state, the path metric being formed as the sum of a previous state path metric and the associated branch metric for the transition. This minimum now becomes the state path metric for the next iteration. The comparison is performed in the ACSUs 104.
3. Store the decision of which branch won the comparison for each state into the SMU 106.

As noted above, this iterative process is performed once for every bit or symbol in the received block of N bits or symbols to be decoded in order to complete one decoding iteration which produces a single updated estimate of the received sequence for each bit or symbol. To maximize throughput, a state parallel architecture can be utilized in which the inner loop operations are performed in parallel for the multiple states, as illustrated in FIG. 1. However, the outer loop operations cannot be done in parallel because updated path metrics for each state from one iteration are required as input for the next iteration.

The decoding algorithm is finalized by identifying the state having the minimum final path metric after all the bits or symbols of the received block have been processed. This state is referred to as the winning state. From the winning state, the decoding decision that is stored there is traced back to the state that preceded it. This trace-back process is continued until the state corresponding to the start of the block is reached. The path defined by these decisions identifies the most likely transmitted sequence of bits or symbols, and is processed to yield the decoder output.

Unlike the Viterbi algorithm, the above-noted MAP algorithm uses a forward and reverse pass across the trellis to find the maximum a-posteriori probability of each bit or symbol in the transmitted sequence. The MAP algorithm is described in greater detail in L. R. Bahl, J. Cocke, F. Jelinek & J. Raviv, "Optimal decoding of linear codes for minimizing symbol error rate," IEEE Trans. Inform. Theory, Vol. IT-20, pp. 284–287, March 1974, which is incorporated by reference herein.

The Viterbi and MAP algorithms are both based on sequential processing, with operations being performed for each bit or symbol in a received block depending on the result of the ACS calculations for a previous bit or symbol. This dependency prevents pipelining of the ACS operation above the bit or symbol rate and hence limits the speed at which a convolutional code can be decoded, thereby limiting the throughput of the decoder.

For applications requiring greater error correcting capability, serial or parallel concatenation of two or more convolutional codes are often used. An example of a concatenated code is the so-called Turbo code described in, e.g., C. Berrou, A. Glavieux, & P. Thitimajshima, "Near Shannon limit error-correcting coding: Turbo codes," Proc. IEEE Int. Conf. Comm., Geneva Switzerland, 1993, pp. 1064–1070, which is incorporated by reference herein. The decoding of concatenated codes requires the result of decoding one code trellis as input for decoding the next code trellis, and so on for subsequent code trellises. Such iterative serial processing requires that either a Viterbi or MAP decoder trace sequentially through each trellis multiple times, with subsequent iterations waiting on the result of prior decoding results. When implemented in hardware, the sequential nature of the decoding algorithms necessitates a bit or symbol serial architecture. This multiplies the latency of the Viterbi or MAP decoder by the number of iterations to be performed and the number of constituent codes, thereby resulting in a substantial decoding latency for concatenated codes.

As previously noted, the recursive dependency of the Viterbi and MAP algorithms also makes it impossible to pipeline the calculations in order to improve the decoder throughput. Although it is possible to run the decoder at a higher clock speed in order to improve throughput and minimize latency, such an approach increases the power dissipation of the decoder. The power and latency problems associated with decoding concatenated codes often limit their use for practical applications. Furthermore, even when such codes are used, the number of iterations may be restricted, thus sacrificing coding gain to meet latency requirements. If it were possible to perform each decoding iteration for such codes with lower latency the decoder performance could be improved by increasing the number of iterations performed.

It is also known in the art that it is possible to formulate a block-serial decoding process of a specific class of codes, i.e., compound codes, using probability dependency graphs. A compound code refers generally to a code resulting from a combination of multiple codes. See, e.g., F. R. Kschischang & B. J. Frey, "Iterative decoding of compound codes by probability propagation in graphical models," IEEE Journal on Selected Areas in Comm., Vol. 16, No. 2, pp. 219–230, February 1998, which is incorporated by reference herein. However, such techniques have not heretofore been applied to block-parallel decoding of general codes, including convolutional codes, Turbo codes or other concatenated codes, etc., where a general code includes any code for which a parity check matrix can be determined.

As is apparent from the foregoing, a need exists for improved decoding algorithms and corresponding decoder architectures which provide improved throughput and reduced latency, without increasing power dissipation.

SUMMARY OF THE INVENTION

The invention provides block-parallel decoding algorithms and corresponding decoder architectures for performing iterative decoding of a wide variety of different codes, including, for example, convolutional codes, Turbo codes or other concatenated codes which are based on convolutional codes, block codes, etc.

Advantageously, the invention reformulates the decoding problem for general codes into a block-parallel form and eliminates the serial dependencies inherent in the conventional block-serial decoding algorithms and decoder architectures described above, thereby substantially reducing latency and increasing throughput.

In accordance with the invention, a block-parallel decoding algorithm and corresponding decoder architecture utilizes a set of interconnected processing nodes configured in the form of a probability dependency graph. The probability dependency graph is characterized at least in part by the code used to encode the blocks of bits or symbols, and the processing nodes implement a block-parallel decoding process for the blocks of bits or symbols to be decoded.

In an illustrative embodiment of the invention, the probability dependency graph is in the form of a bipartite probability dependency graph which includes a set of N variable nodes and a set of T check nodes, with one of the N variable nodes being associated with each of N bits or symbols of a given block to be decoded. A single iteration of the block-parallel decoding process produces within the variable nodes an updated estimate for every bit or symbol in the given block. The block-parallel decoding process in this case is initiated by sending to each check node connected to a variable node a function $f(Rx_i)$ where $Rx_i$ is the received bit or symbol, $i=0, 1, \ldots N-1$, and $f(.)$ is a function determined at least in part by the code, such as a threshold function, a linear scaling function, or an approximate exponential function.

The block-parallel decoding process includes calculating in parallel at each of the check nodes a function $g(.)$ of the input from the variable nodes connected to that check node, and sending to the connected variable nodes the result of these check node calculations. The function $g(.)$ may include, e.g., a parity check function, a hyperbolic tangent function in the log domain, or a maximum function in the log domain. For example, the function $g(.)$ may include a parity check function and additionally a function to update an indication of the reliability with which the current inputs satisfy the parity check constraints. The additional reliability update function may be a hyperbolic tangent function in the log domain.

The block-parallel decoding process further includes calculating in parallel at each of the variable nodes a function $h(.)$ of the input from the check nodes connected to that variable node, and sending to the connected check nodes the result of these variable node calculations. The function $h(.)$ may be, e.g., a majority function or an averaging function.

The block-parallel decoding process is terminated when all check nodes satisfy a constraint of the code or after a maximum number of iterations. Upon termination, the values at the variable nodes determine the estimated, i.e., decoded, transmitted bit or symbol and possibly an associated a-posteriori probability or reliability.

In another illustrative embodiment of the invention, the probability dependency graph is in the form of a directional probability dependency graph with multiple levels of nodes including an initial level, at least one intermediate level and a final level, arranged such that calculations can be performed at each level without sequential intra-block dependencies. The initial level of nodes includes an input node for each bit or symbol in a given block to be decoded. The nodes in each intermediate level receive inputs only from nodes of a previous level and deliver outputs only to nodes of a subsequent level. The outputs of the nodes of the final level give an estimate of the transmitted bits or symbols for the given block. The block-parallel decoding process is initialized in this embodiment by providing as input to each node in the initial level a function $f(Rx_i)$ where $Rx_i$ is the received bit or symbol, $i=0, 1, \ldots N-1$, and $f(.)$ is a function determined at least in part by the code, such as a threshold function, a linear scaling function, or an approximate exponential function. Each intermediate level of nodes then calculates a function $g(.)$ of incoming values from the previous level of nodes, and passes the result of the calculation to the next level of nodes, such that each of the levels produces an updated estimate for every bit or symbol in the given block.

In accordance with another aspect of the invention, the set of interconnected processing nodes may be implemented using one or more programmable computation units. For example, a different computation unit may be used to implement each node, or to implement a given set of multiple nodes. Such computation units may comprise reconfigurable hardware or other devices suitable for implementing different block-parallel decoding processes for different codes.

BRIEF DESCRIPTION OF THE DRAWINGS

FIG. 8 shows an example hard-decision implementation of a directional network probability dependency graph decoder of the type shown in FIG. 7.

DETAILED DESCRIPTION OF THE INVENTION

The present invention will be illustrated herein using a number of exemplary decoding algorithms and corresponding decoder architectures. It should be understood that these are merely illustrations of particular embodiments of the invention, and that the invention is more generally applicable to any decoding algorithm or corresponding decoder architecture which can benefit from the increased throughput and latency reduction associated with block-parallel decoding on a probability dependency graph.

The term "general code" as used herein is intended to include, by way of example and without limitation, any code for which an associated parity check matrix may be constructed, derived or otherwise determined.

The term "probability dependency graph" is intended to include, by way of example and without limitation, any representation of interconnected nodes configured such that an exact or approximate probability of a value associated with a given node can be expressed in terms of exact or approximate probabilities of one or more values associated with one or more nodes connected to the given node. The exact or approximate probabilities may be exact or approximate a-posteriori probabilities.

Figure 1:
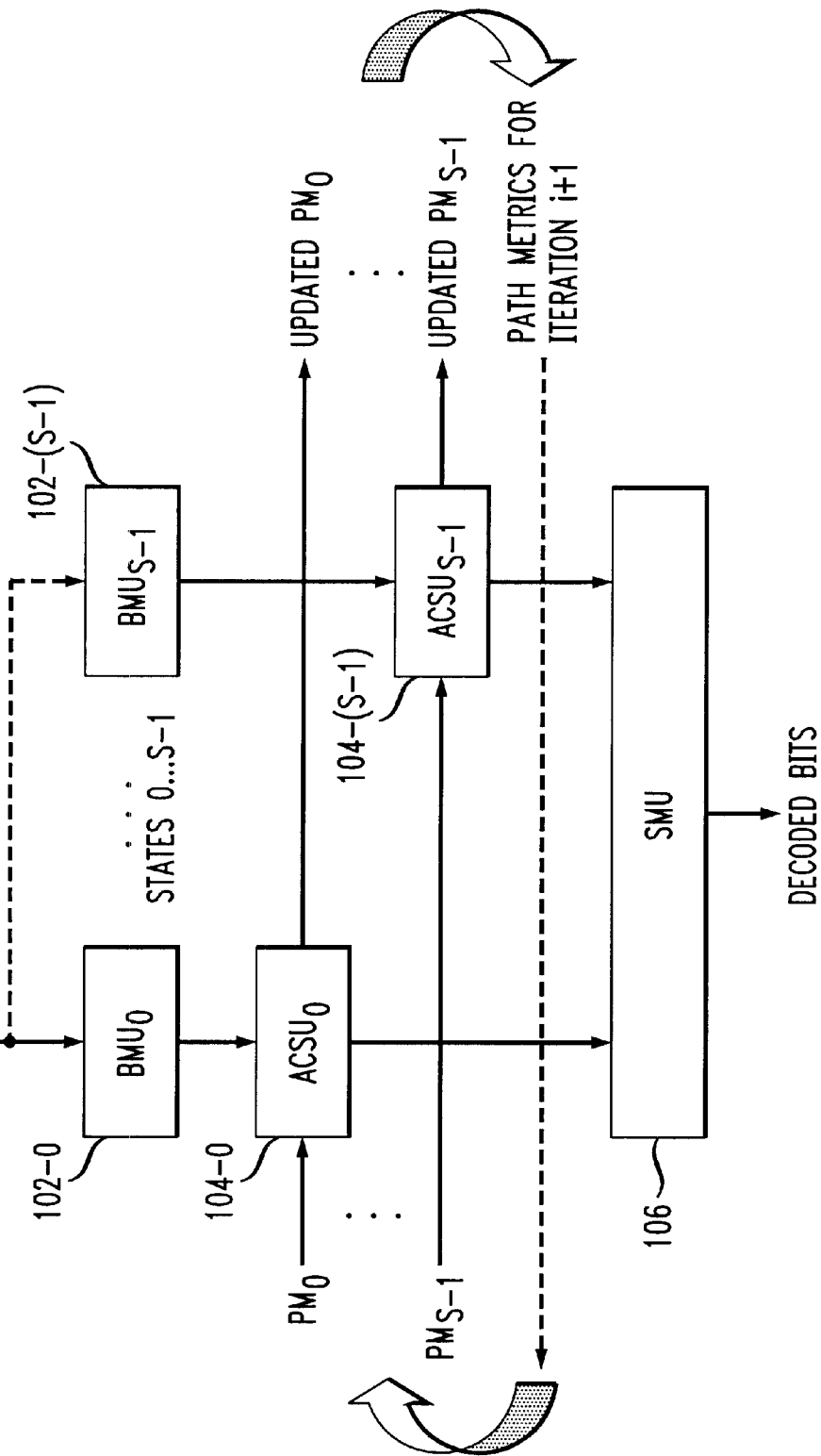
FIG. 1 shows a conventional block-serial Viterbi decoder.

The present invention in the illustrative embodiments provides block-parallel algorithms for decoding a code represented by a probability dependency graph, and corresponding block-parallel decoder architectures. In accordance with one aspect of the invention, a given decoder architecture represents a physical instantiation of a probability dependency graph, with nodes in the graph corresponding to computation units or suitable portions thereof and edges in the graph corresponding to connections between nodes. The present invention is based in part on the recognition by the inventors that probability dependency graphs do not include intra-block sequential dependencies, and therefore can be used as a basis for developing decoding algorithms and architectures that are both block-parallel and pipelinable. Advantageously, a decoder architecture in accordance with the invention provides substantial throughput and latency advantages compared to conventional block-serial decoder architectures such as that described in conjunction with FIG. 1.

Figure 2:
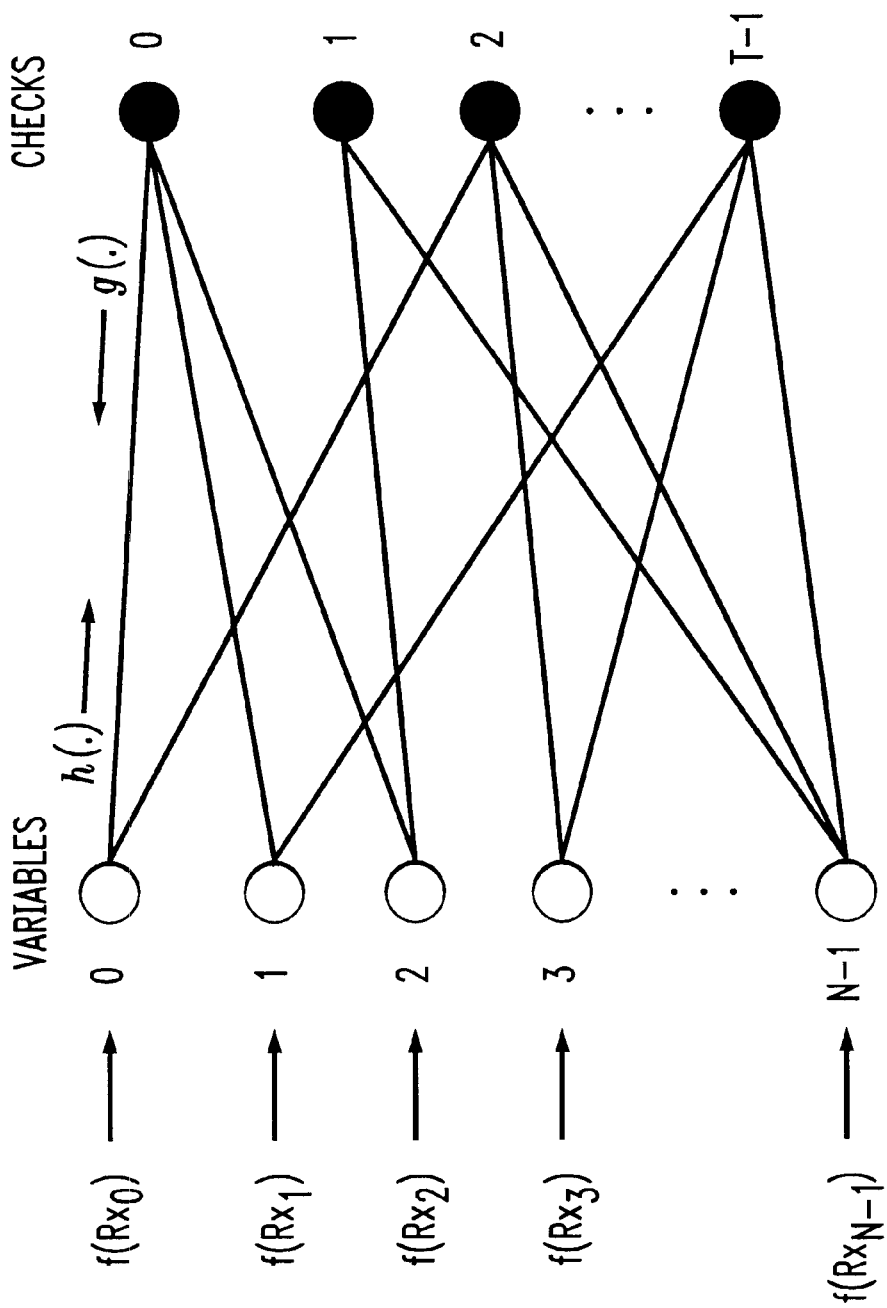
FIG. 2 shows a block-parallel bipartite probability dependency graph decoder in accordance with a first illustrative embodiment of the invention.
Figure 7:
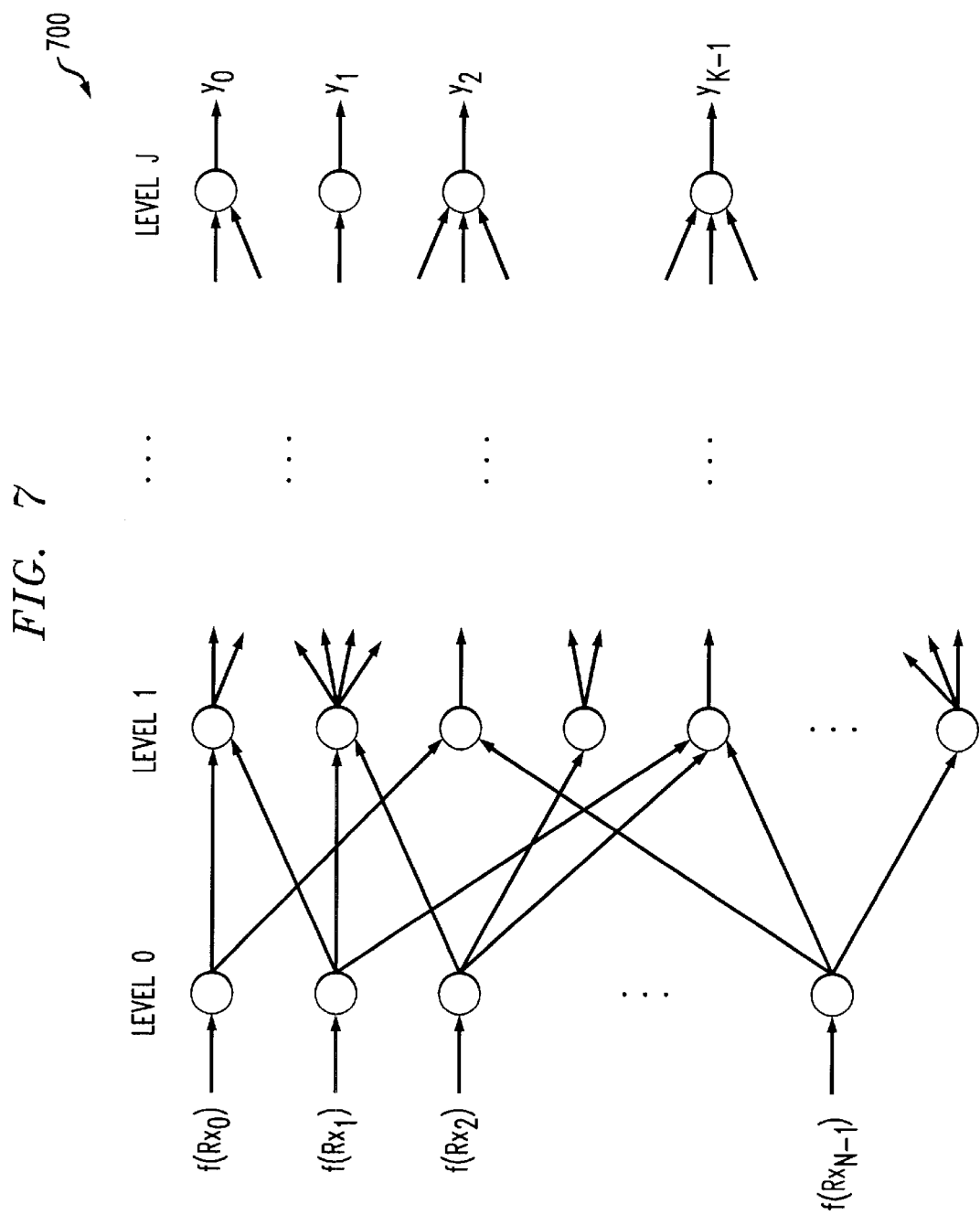
FIG. 7 shows a block-parallel directional network probability dependency graph decoder in accordance with a second illustrative embodiment of the invention.

FIGS. 2 and 7 show two illustrative decoder architectures for block-parallel decoding algorithms in accordance with the invention. In these example architectures, it is assumed that the block being decoded comprises N received bits or symbols.

FIG. 2 shows an illustrative embodiment of a block-parallel bipartite probability dependency graph decoder 200 in accordance with the invention. The decoder 200 includes elements implemented in the form of a bipartite probability dependency graph which includes two types of nodes, i.e., variable nodes and check nodes. One variable node is required for every received bit or symbol in a given block to be decoded, for a total of N variable nodes. The number of check nodes is denoted as T, and is determined by the code and number of bits or symbols in the block. The connectivity of the variable and check nodes is determined by the code.

In the decoder 200 of FIG. 2, the variable nodes are denoted by open circles, and the check nodes are denoted by solid circles. Each of the nodes in this embodiment is assumed to be a processing node which corresponds to a computation unit capable of performing one or more of the operations described below. It should be understood, however, that the variable and check nodes may be grouped such that multiple nodes are evaluated using the same processing node, e.g., in cases where the throughput requirement is lower than the processing speed of the variable and check nodes. In such an arrangement, a single computation unit may be used to implement multiple nodes of the probability dependency graph. A given processing node may thus be implemented using a single dedicated computation unit, or a portion of a such a unit. Each of the nodes in the decoder 200 and other decoders described herein may thus represent a single computation unit or a portion of a multiple-node computation unit.

The decoder 200 is initialized by sending to each check node connected to a variable node a function of the received value, e.g., $f(Rx_i)$ where $Rx_i$ is the received bit or symbol, $i=0, 1, \ldots N-1$, and $f(.)$ is a function determined by the code, e.g., a threshold function, linear scaling function, or approximate exponential function. This initialization is shown on the left side of the variable nodes in FIG. 2. The decoder 200 then iterates the following operations:

1. At each of the check nodes, denoted $C_0, C_1, \ldots C_{T-1}$, calculate a possibly different function $g(.)$ of the input from the variable nodes connected to that check node. For example, different functions $g(.)$ may be used at different check nodes, or the function(s) used could change with the number of iterations or another parameter. The function $g(.)$ used at a given one of the check nodes may be, e.g., a parity check function, a hyperbolic tangent function in the log domain, or a maximum function in the log domain. Send to the connected variable nodes the result of these calculations, which is usually a different value for each connected variable node. These calculations may be performed in parallel.

2. At each of the variable nodes, denoted $V_0, V_1, \ldots V_{N-1}$, calculate a possibly different function $h(.)$ of the input from the check nodes connected to that variable node. For example, different functions $h(.)$ may be used at different variable nodes, or the function(s) used could change with the number of iterations or another parameter. The function $h(.)$ used at a given one of the variable nodes may include, e.g., a majority function or an averaging function. Send to the connected check nodes the result of these calculations. Again, these calculations may be performed in parallel.

A single iteration of this process produces an updated estimate for every bit or symbol in the received block. Advantageously, each of the calculations of a given iteration may be performed in a block-parallel manner, without the sequential intra-block dependencies of conventional decoding algorithms and their corresponding architectures.

The decoding algorithm in the decoder 200 is terminated when all check nodes satisfy a constraint of the code or after a maximum number of iterations, and the calculation results at the variable nodes give the decoded estimates of the transmitted values for those variables. The maximum number of iterations is generally dependent upon the particular implementation, e.g., may correspond to whatever number of iterations can be accomplished within an available time period in a particular implementation.

The probability dependency graph of the decoder 200 may be constructed utilizing a parity check matrix H associated with the corresponding code, with one variable node associated with each column in H, and one check node associated with each row in H. Every set element $h_{nm}$ in H corresponds to a connection between a variable node n and a check node m. Hence, the number of edges in the graph entering or leaving a variable node n in the decoder is equal to the number of non-zero entries in column n of H, and the number of edges in the graph entering or leaving a check node m in the decoder is equal to the number of non-zero entries in row m of H. Row operations may be performed on H to reduce the number of edges in the graph, improve the structure or performance of the decoder, etc.

A test for completion may be performed in the decoder 200 by testing whether the current decoded bits $x_i$, $i \in \{0, 1, \ldots N-1\}$ at the variable nodes satisfy the parity check matrix, $$H \cdot x = 0,$$

where x is the decoded bit vector $\{x_0, x_1, \ldots x_{N-1}\}$ and 0 is an m-bit zero vector, m corresponding to the number of rows in the parity check matrix and the number of check nodes. An alternative completion test may be performed by testing that all check nodes are satisfied by their current inputs, $$chk_i = 0 \forall i \in \{0, 1, \ldots, K-1\},$$

where $chk_i$ is the exclusive-or of all inputs to check node i.

Figure 3:
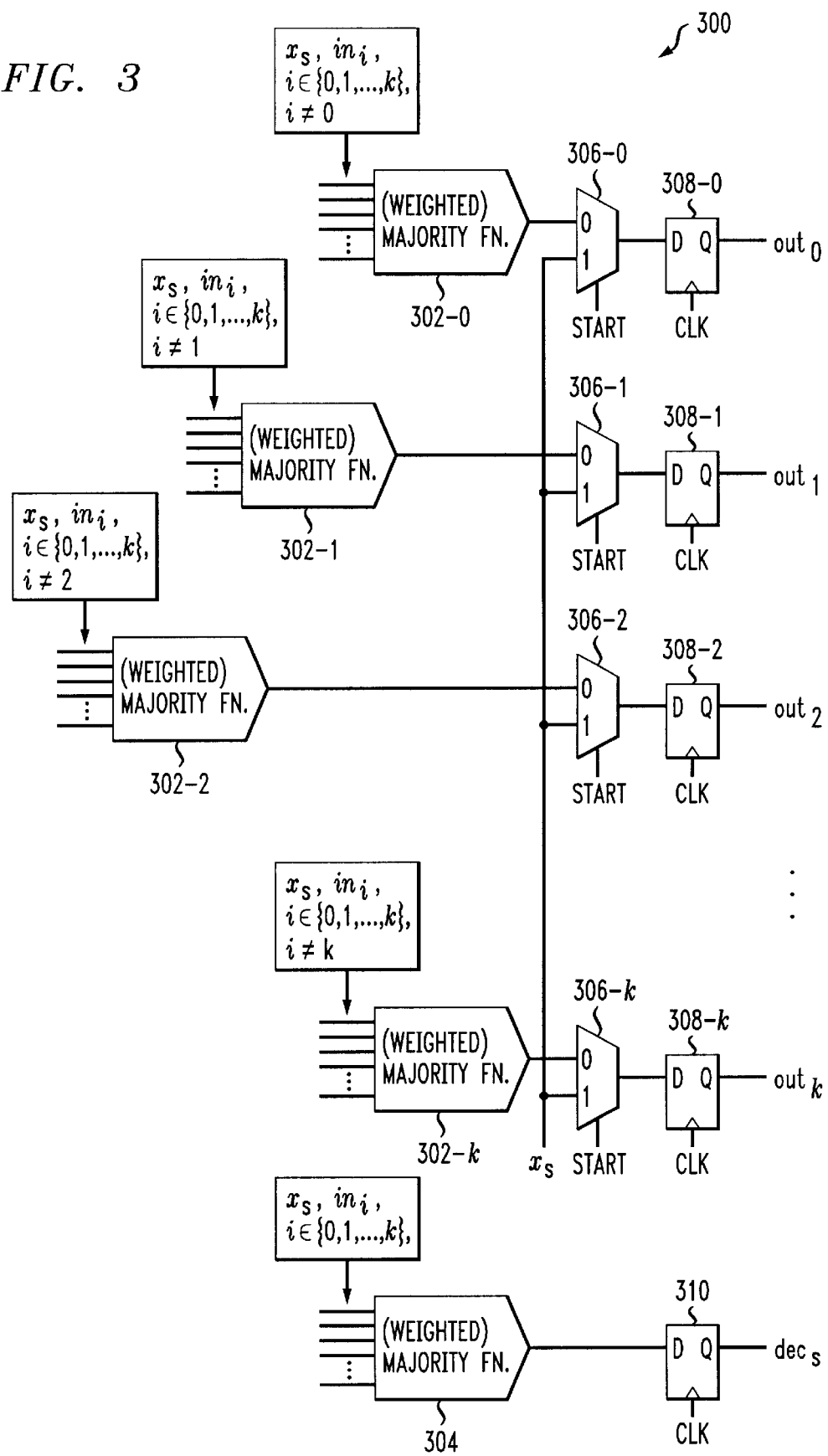
FIGS. 3 and 4 show examples of variable and check nodes, respectively, for use in a hard-decision decoder implemented as shown in FIG. 2.
Figure 4:
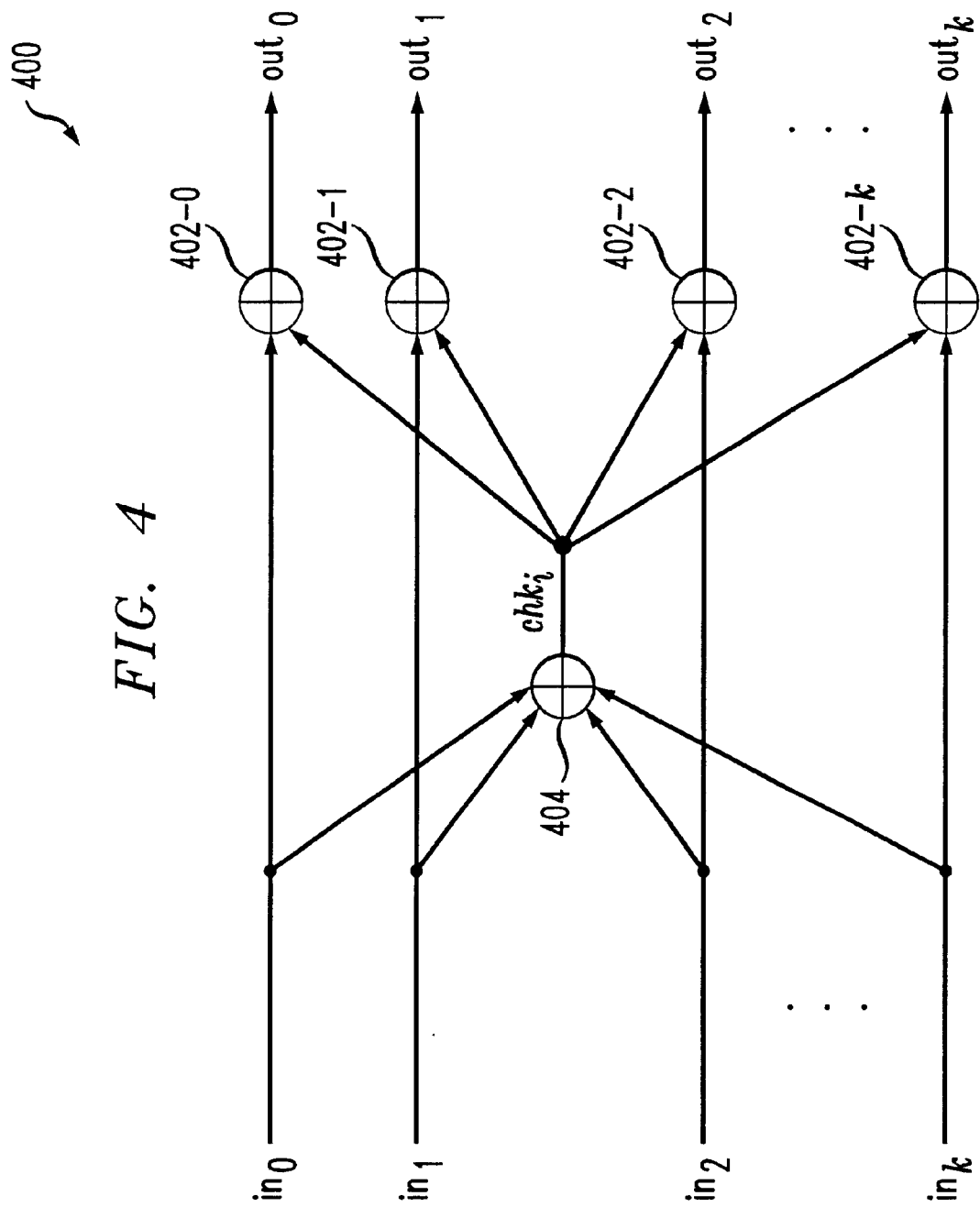

FIGS. 3 and 4 show examples of variable and check nodes, respectively, in a hard-decision implementation of the decoder 200 of FIG. 2. Referring to FIG. 3, a given variable node 300 includes a set of elements 302-0, 302-1, 302-2, ... 302-k, each implementing a weighted majority function of a particular partial set of inputs. An additional element 304 implements a weighted majority function of a full set of inputs. Each of the weighted majority function elements 302-0, 302-1, 302-2, ... 302-k supplies a decision output to a corresponding one of a set of 2-to-1 multiplexers 306-0, 306-1, 306-2, ... 306-k. The multiplexers are each driven by a common start signal, and the outputs thereof are latched in D-type flip-flops 308-0, 308-1, 308-2, ... 308-k which are driven by a common clock signal. Outputs of the flip-flops represent the variable node outputs $out_0, out_1, out_2, \ldots out_k$. The output of the majority function element 304 is latched in a D-type flip-flop 310, the output of which represents a decision signal $dec_s$.

Referring to FIG. 4, a given check node 400 includes a set of exclusive-or gates 402-0, 402-1, 402-2, ... 402-k, each of which receives one of a set of inputs $in_0, in_1, in_2, \ldots in_k$, and generates one of a corresponding set of outputs $out_0, out_1, out_2, \ldots out_k$. The check node 400 further includes an additional exclusive-or gate 404 which receives as inputs each of the inputs $in_0, in_1, in_2, \ldots in_k$, and generates as an output the above-described $chk_i$ signal. This output is then supplied as an input to each of the exclusive-or gates 402-0, 402-1, 402-2, ... 402-k.

Figure 5:
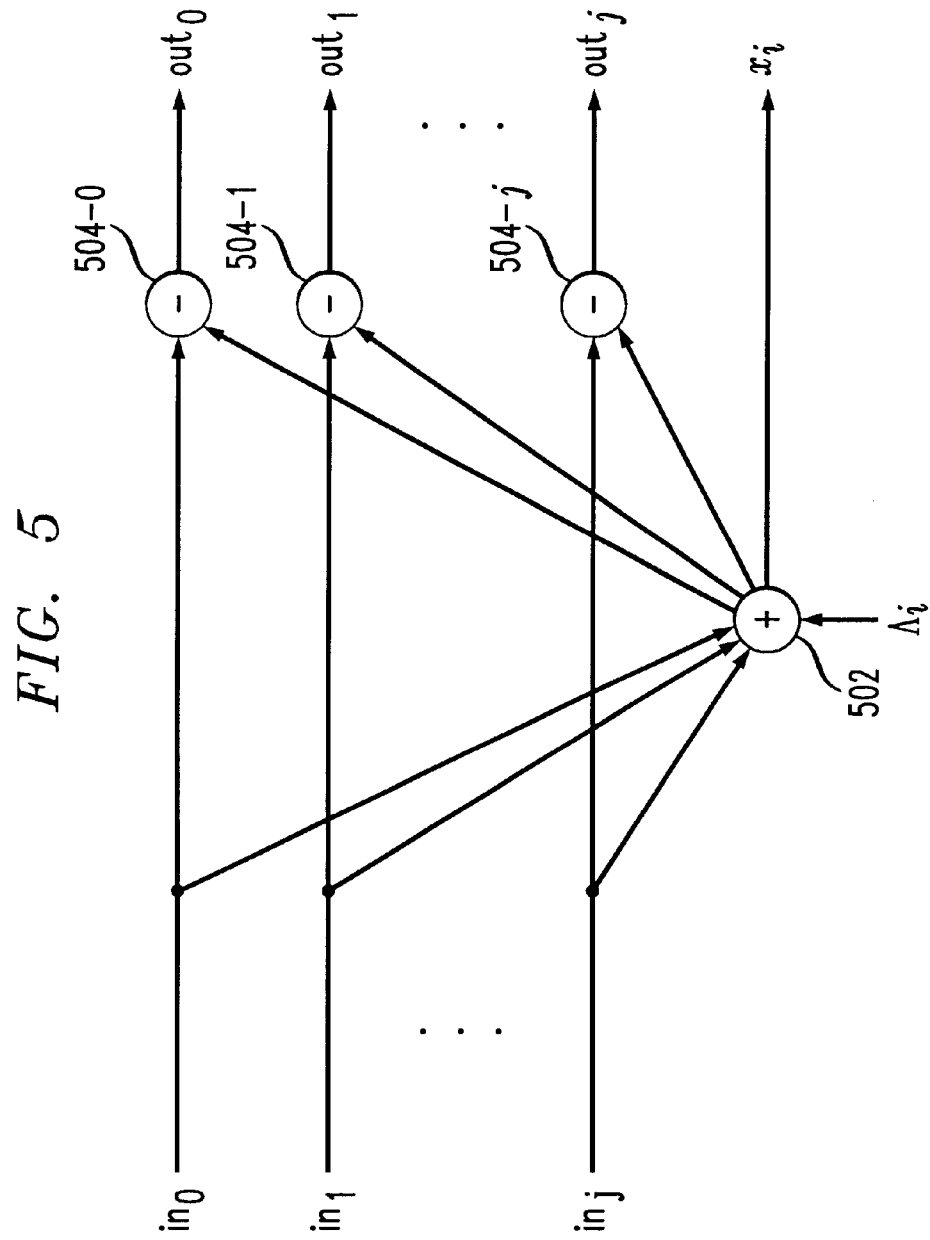
FIGS. 5 and 6 show examples of variable and check nodes, respectively, for use in a soft-decision decoder implemented as shown in FIG. 2.
Figure 6:
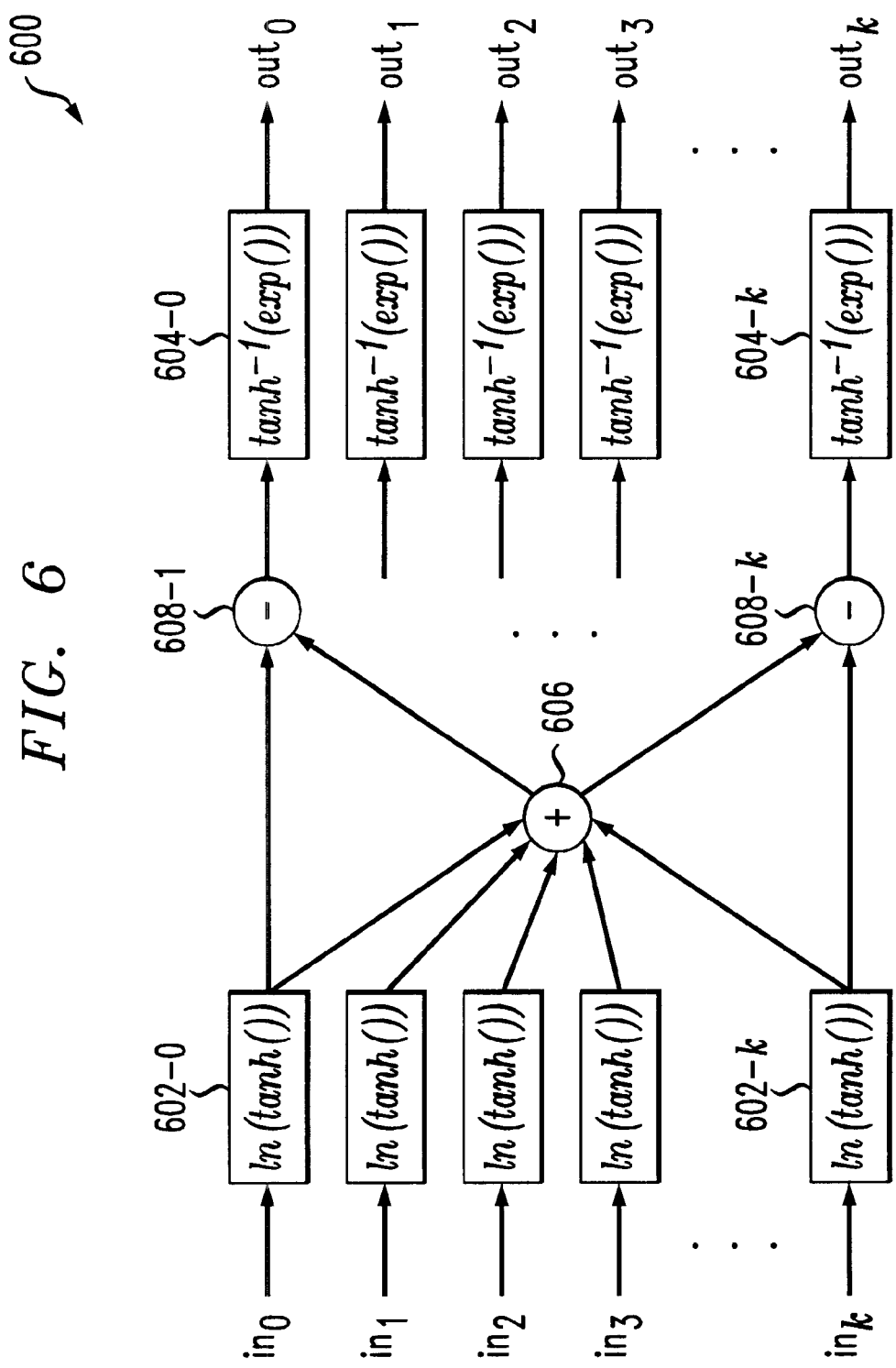

FIGS. 5 and 6 show examples of variable and check nodes, respectively, in a soft-decision implementation of the decoder 200 of FIG. 2. In a soft-decision decoder, there is a reliability associated with the sign of each message being passed. The check nodes may therefore include a circuit configured to update the reliabilities, in addition to a parity check of the type present in the hard-decision decoder and illustrated in FIG. 4.

Referring to FIG. 5, an update portion of a variable node 500 for the soft-decision decoder comprises an adder 502 and a set of subtractors 504-0, 504-1, ... 504-j. It is assumed that within each variable node $V_i$, $i \in \{0, 1 \ldots, N-1\}$, the received value $Rx_i$ is operated on by a function f(.), e.g. a linear scaling function, and produces a result $\Lambda_i$. The variable node update of FIG. 5 is then performed in accordance with the following equations:

$$out_0 = \frac{1}{k}(\Lambda_i + in_0 + in_1 + \ldots + in_j - in_0)$$

$$out_1 = \frac{1}{k}(\Lambda_i + in_0 + in_1 + \ldots + in_j - in_1)$$

$$\vdots$$

$$out_j = \frac{1}{k}(\Lambda_i + in_0 + in_1 + \ldots + in_j - in_j)$$

where k is a normalization constant. These outputs of the FIG. 5 circuit represent the above-noted reliabilities.

FIG. 6 shows an example of a reliability update circuit portion of a check node 600 in a soft-decision decoder in accordance with the invention. The check node 600 includes a set of input function elements 602-0 through 602-k, a set of output function elements 604-0 through 604-k, an adder 606, and a set of subtractors 608-1 through 608-k. The input function elements implement natural logs of hyperbolic tangents in this example, while the output function elements implement complementary operations. The adder 606 receives outputs from each of the input function elements, and delivers the resulting sum to each of the subtractors. The different between the sum and the individual function element outputs are applied to the output function elements to generate the corresponding updated outputs.

The implementation shown in FIG. 6 can be simplified by, e.g., updating the check nodes using a max-log rule as opposed to the hyperbolic tangent. Using this simplification, the reliability for each output i is given as the maximum reliability of all inputs, excluding input i, performed in the log domain:

$$out_i = \exp(\max_{j,j \neq i}(\ln(in_j))).$$

FIG. 7 shows an illustrative embodiment of a block-parallel Bayesian network probability dependency decoder 700 in accordance with the invention. The decoder 700 includes elements implemented in the form of a directional Bayesian network probability dependency graph. The graph includes an input node for every bit or symbol in the block to be decoded. These input nodes are denoted as Level 0 in the figure. The graph includes further levels of nodes such that any node has inputs only from the previous level and has outputs only to the subsequent level. This arrangement allows calculations to be performed at each level with no sequential intra-block dependencies. The number of decoder stages, nodes per level, and connections required between the nodes are determined by the code. The final level of nodes is denoted Level J and yields an estimate $y_0 \ldots y_{K-1}$ of the transmitted sequence.

The decoder 700 is initialized by providing as input to each node in Level 0 a function of the received value, e.g., $f(Rx_i)$ where $Rx_i$ is the received bit or symbol, i=0, 1, ... N-1, and f(.) is a function determined by the code, e.g., a threshold function, a linear scaling function or an approximate exponential function. This initialization input is shown on the left side of the Level 0 nodes in FIG. 7.

Each level of the decoder 700 calculates a possibly different function g(.) of the incoming values from the previous level, and the result of this calculation is passed onto the next level of the decoder 700. As previously noted, the function g(.) may be, e.g., a parity check function, a hyperbolic tangent function in the log domain, or a maximum function in the log domain.

A single level of this decoding process produces an updated estimate for every bit or symbol in the received block. As previously noted, the final level of the decoder, i.e., Level J, produces the estimate $y_0 \ldots y_{K-1}$ of the transmitted sequence. The number of outputs K will in general be less than the number of inputs, i.e., K<N.

It is evident that the information flow in the probability dependency graph of the decoder 700 is directed, rather than bi-directional as in the bipartite graph decoder 200 of FIG. 2. This directed structure without recursive dependence is well suited for pipelining to produce very high throughput decoders.

FIG. 8 shows an example of a hard decision directional network probability dependency graph decoder 800 in accordance with the invention. The decoder 800 represents a particular hard decision implementation of a decoder of the type shown in FIG. 7. The decoder 800 includes multiple levels of interconnected nodes, with variable nodes denoted by open circles and check nodes denoted by solid circles. The first level of nodes is denoted Level 0 and includes a set of variable nodes each of which receives a function $f(Rx_i)$ where $Rx_i$ is the received bit or symbol. The next level of nodes is denoted Level 1 and includes a set of check nodes. The levels then alternate between a level of variable nodes and a level of check nodes. The final level of nodes is denoted Level J and includes a set of variable nodes which yield an estimate $y_0 \ldots y_{K-1}$ of the transmitted sequence. It should be noted that there may be different numbers of variable nodes and check nodes within the levels of the decoder.

Associated with each of the variable nodes of the non-final variable node levels in the decoder 800 is a latch which may be implemented in the form of a D-type flip-flop as shown in the figure. For example, associated with the variable nodes of Level 0 in decoder 800 are latches 802-0, 802-1, 802-2, ... 802-(N−1). In the check node levels of decoder 800, such as Level 1, there is one buffer for each variable node of the previous level. For example, Level 1 of the decoder 800 includes a total of N buffers 804-0, 804-1, 804-2, ... 804-(N−1). Each buffer has an input coupled to an output of a latch of a variable node in a previous level, and an output coupled to an input of a latch of a variable node of a subsequent level.

Connections between the variable nodes and the check nodes of the various levels of the decoder 800 are defined by the parity check matrix of the corresponding code. The number of levels determines the number of iterations that the decoder performs. The variable nodes and check nodes in the decoder 800 may be configured in a manner similar to the hard-decision bipartite probability graph decoder variable nodes and check nodes of FIGS. 3 and 4, respectively.

The connectivity and computation units of the decoder architectures of the present invention can be made programmable, using reconfigurable hardware techniques well known in the art, thereby allowing the decoding of many different codes on the same decoder hardware.

The present invention is applicable to a wide variety of codes, including, for example, convolutional codes, Turbo codes, Hamming codes, Product codes, Low Density Parity Check (LDPC) codes, Generalized LDPC (GLD) codes, Tanner Graphs, linear or cyclic block codes, concatenated block codes, etc.

It should again be emphasized that the exemplary decoders described herein are intended to illustrate the operation of the invention, and therefore should not be construed as limiting the invention to any particular embodiment or group of embodiments. For example, the particular arrangements and interconnectivity of decoder elements will vary depending upon application-specific factors such as the code. Moreover, many different hardware implementations of the probability dependency graph decoders described herein are possible. These and numerous other alternative embodiments within the scope of the following claims will be apparent to those skilled in the art.

What is claimed is:

1. An apparatus for decoding received bits or symbols, comprising:
   a set of interconnected processing nodes implemented in the form of a probability dependency graph characterized at least in part by a code used to encode the bits or symbols, the processing nodes implementing a block-parallel decoding process for a given block of the bits or symbols to be decoded;
   the set of interconnected processing nodes comprising a plurality of check nodes and a plurality of variable nodes, each of at least a subset of the variable nodes being associated with a corresponding one of the bits or symbols to be decoded;
   wherein the block-parallel decoding process includes at least one of:
   (i) calculating at each of at least a subset of the check nodes a function of input from the variable nodes connected to that check node, and sending to the connected variable nodes the result of these check node calculations, wherein the check node calculations are performed in parallel; and
   (ii) calculating at each of at least a subset of the variable nodes a function of input from the check nodes connected to that variable node, and sending to the connected check nodes the result of these variable node calculations, wherein the variable node calculations are performed in parallel.

2. The apparatus of claim 1 wherein the probability dependency graph comprises a bipartite probability dependency graph.

3. The apparatus of claim 2 wherein the given block includes N bits or symbols to be decoded, and the set of interconnected processing nodes further comprises a set of N variable nodes and a set of T check nodes, with one of the N variable nodes being associated with each of the N bits or symbols to be decoded.

4. The apparatus of claim 3 wherein the block-parallel decoding process is initiated by sending to each check node connected to a variable node a function $f(Rx_i)$ where $Rx_i$ is the received bit or symbol, i=0, 1, ... N−1, and f(.) is a function determined at least in part by the code.

5. The apparatus of claim 3 wherein the block-parallel decoding process includes calculating at each of the check nodes a function g(.) of the input from the variable nodes connected to that check node, and sending to the connected variable nodes the result of these check node calculations, wherein the calculations are performed in parallel.

6. The apparatus of claim 5 wherein the function g(.) comprises at least one of a parity check function, a hyperbolic tangent function in the log domain, and a maximum function in the log domain.

7. The apparatus of claim 5 wherein the block-parallel decoding process further includes calculating at each of the variable nodes a function h(.) of the input from the check nodes connected to that variable node, and sending to the connected check nodes the result of these variable node calculations, wherein the variable node calculations are performed in parallel.

8. The apparatus of claim 7 wherein the function h(.) comprises at least one of a majority function and an averaging function.

9. The apparatus of claim 3 wherein results of the block-parallel decoding process at the variable nodes give an estimate of the associated a-posteriori probability or reliability of the decoded bits or symbols.

10. The apparatus of claim 2 wherein a single iteration of the block-parallel decoding process produces an updated estimate for every bit or symbol in the given block.

11. The apparatus of claim 2 wherein a single iteration of the block-parallel decoding process produces an updated estimate for an a-posteriori probability or reliability for every bit or symbol in the given block.

12. The apparatus of claim 2 wherein the block-parallel decoding process is terminated after a maximum number of iterations.

13. The apparatus of claim 1 wherein the nodes are implemented using a plurality of programmable computation units, the programmable computation units being reconfigurable to implement different block-parallel decoding processes for different codes.

14. The apparatus of claim 1 wherein the code comprises a convolutional code.

15. The apparatus of claim 1 wherein the code comprises a code based at least in part on a convolutional code.

16. The apparatus of claim 1 wherein the code comprises a block code.

17. An apparatus for decoding received bits or symbols, comprising:

a set of interconnected processing nodes implemented in the form of a probability dependency graph characterized at least in part by a code used to encode the bits or symbols, the processing nodes implementing a block-parallel decoding process for a given block of the bits or symbols to be decoded;

wherein the given block includes N bits or symbols to be decoded, and the set of interconnected processing nodes further comprises a set of N variable nodes and a set of T check nodes, with one of the N variable nodes being associated with each of the N bits or symbols to be decoded;

wherein the block-parallel decoding process is initiated by sending to each check node connected to a variable node a function $f(Rx_i)$ where $Rx_i$ is the received bit or symbol, i=0, 1, . . . N−1, and f(.) is a function determined at least in part by the code; and wherein the function f(.) comprises at least one of a threshold function, a linear scaling function and an approximate exponential function.

18. An apparatus for decoding received bits or symbols, comprising:

a set of interconnected processing nodes implemented in the form of a probability dependency graph characterized at least in part by a code used to encode the bits or symbols, the processing nodes implementing a block-parallel decoding process for a given block of the bits or symbols to be decoded;

wherein the given block includes N bits or symbols to be decoded, and the set of interconnected processing nodes further comprises a set of N variable nodes and a set of T check nodes, with one of the N variable nodes being associated with each of the N bits or symbols to be decoded; and wherein the block-parallel decoding process is terminated when all check nodes satisfy a constraint of the code.

19. An apparatus for decoding received bits or symbols, comprising:

a set of interconnected processing nodes implemented in the form of a probability dependency graph characterized at least in part by a code used to encode the bits or symbols, the processing nodes implementing a block-parallel decoding process for a given block of the bits or symbols to be decoded;

wherein the probability dependency graph comprises a directional probability dependency graph;

wherein the set of interconnected processing nodes further comprises a plurality of levels of nodes including an initial level, at least one intermediate level and a final level; and wherein the levels of nodes are configured such that the nodes in at least one intermediate level receive inputs only from nodes of a previous level and deliver outputs only to nodes of a subsequent level, such that calculations can be performed at each level without sequential intra-block dependencies.

20. The apparatus of claim 19 wherein the initial level of nodes comprises an input node for each bit or symbol in the given block.

21. The apparatus of claim 19 wherein outputs of the nodes of the final level give an estimate of the transmitted bits or symbols for the given block.

22. The apparatus of claim 19 wherein outputs of the nodes of the final level give an estimate of the transmitted bits or symbols for the given block and an estimate of their associated a-posteriori probabilities or reliabilities.

23. The apparatus of claim 19 wherein the block-parallel decoding process is initialized by providing as input to each node in the initial level a function $f(Rx_i)$ where $Rx_i$ is the received bit or symbol, i=0, 1, . . . N−1, and f(.) is a function determined at least in part by the code.

24. The apparatus of claim 23 wherein the function f(.) comprises at least one of a threshold function, a linear scaling function, and an approximate exponential function.

25. The apparatus of claim 19 wherein each intermediate level of nodes calculates a function g(.) of incoming values from the previous level, and passes the result of the calculation to the next level of nodes.

26. The apparatus of claim 25 wherein the function g(.) comprises at least one of a parity check function, a hyperbolic tangent function in the log domain, and a maximum function in the log domain.

27. The apparatus of claim 19 wherein each of the levels produces an updated estimate for every bit or symbol in the given block.

28. The apparatus of claim 19 wherein a determination as to whether a word of decoded bits or symbols is a valid codeword of the code is made using a function of inputs from a previous level to indicate convergence to a valid codeword.

29. The apparatus of claim 19 wherein a given series of levels in the plurality of levels alternates between a variable node level and a check node level.

30. An apparatus for decoding received bits or symbols, comprising:

a set of interconnected processing nodes implemented in the form of a probability dependency graph characterized at least in part by a code used to encode the bits or symbols, the processing nodes implementing a block-parallel decoding process for a given block of the bits or symbols to be decoded;

wherein a determination as to whether a word of decoded bits or symbols is a valid codeword of the code is made by determining whether designated parity constraints are satisfied.

31. An apparatus for decoding received bits or symbols, comprising:

a set of interconnected processing nodes implemented in the form of a probability dependency graph characterized at least in part by a code used to encode the bits or symbols, the processing nodes implementing a block-parallel decoding process for a given block of the bits or symbols to be decoded;

wherein a determination as to whether a word of decoded bits or symbols is a valid codeword of the code is made by determining whether a product of the decoded word and a parity check matrix of the code results in the zero vector.

32. A method for decoding received bits or symbols, the method comprising the steps of:

applying the received bits or symbols to a set of interconnected processing nodes configured in the form of a probability dependency graph characterized at least in part by a code used to encode the bits or symbols; and implementing within the processing nodes a block-parallel decoding process for a given block of the bits or symbols to be decoded;

the set of interconnected processing nodes comprising a plurality of check nodes and a plurality of variable nodes, each of at least a subset of the variable nodes being associated with a corresponding one of the bits or symbols to be decoded;

wherein the block-parallel decoding process includes at least one of:

(i) calculating at each of at least a subset of the check nodes a function of input from the variable nodes connected to that check node, and sending to the connected variable nodes the result of these check node calculations, wherein the check node calculations are performed in parallel; and (ii) calculating at each of at least a subset of the variable nodes a function of input from the check nodes connected to that variable node, and sending to the connected check nodes the result of these variable node calculations, wherein the variable node calculations are performed in parallel.

33. The method of claim 32 wherein the probability dependency graph comprises a bipartite probability dependency graph.

34. The method of claim 33 wherein the given block includes N bits or symbols to be decoded, and the set of interconnected processing nodes further comprises a set of N variable nodes and a set of T check nodes, with one of the N variable nodes being associated with each of the N bits or symbols to be decoded.

35. The method of claim 34 wherein the block-parallel decoding process is initiated by sending to each check node connected to a variable node a function $f(Rx_i)$ where $Rx_i$ is the received bit or symbol, i=0, 1, . . . N−1, and f(.) is a function determined at least in part by the code.

36. The method of claim 34 wherein the block-parallel decoding process includes calculating at each of the check nodes a function g(.) of the input from the variable nodes connected to that check node, and sending to the connected variable nodes the result of these check node calculations, wherein the calculations are performed in parallel.

37. The method of claim 36 wherein the function g(.) comprises at least one of a parity check function, a hyperbolic tangent function in the log domain, and a maximum function in the log domain.

38. The method of claim 36 wherein the block-parallel decoding process further includes calculating at each of the variable nodes a function h(.) of the input from the check nodes connected to that variable node, and sending to the connected check nodes the result of these variable node calculations, wherein the variable node calculations are performed in parallel.

39. The method of claim 38 wherein the function h(.) comprises at least one of a majority function and an averaging function.

40. The method of claim 33 wherein a single iteration of the block-parallel decoding process produces an updated estimate for every bit or symbol in the given block.

41. The method of claim 33 wherein a single iteration of the block-parallel decoding process produces an updated estimate for an a-posteriori probability or reliability for every bit or symbol in the given block.

42. The method of claim 33 wherein the block-parallel decoding process is terminated after a maximum number of iterations.

43. The method of claim 34 wherein results of the block-parallel decoding process at the variable nodes give an estimate of the associated a-posteriori probability or reliability of the decoded bits or symbols.

44. The method of claim 32 wherein the nodes are implemented using a plurality of programmable computation units, the programmable computation units being reconfigurable to implement different block-parallel decoding processes for different codes.

45. The method of claim 32 wherein the code comprises a convolutional code.

46. The method of claim 32 wherein the code comprises a code based at least in part on a convolutional code.

47. The method of claim 32 wherein the code comprises a block code.

48. A method for decoding received bits or symbols, the method comprising the steps of:

applying the received bits or symbols to a set of interconnected processing nodes configured in the form of a probability dependency graph characterized at least in part by a code used to encode the bits or symbols; and implementing within the processing nodes a block-parallel decoding process for a given block of the bits or symbols to be decoded;

wherein the given block includes N bits or symbols to be decoded, and the set of interconnected processing nodes further comprises a set of N variable nodes and a set of T check nodes, with one of the N variable nodes being associated with each of the N bits or symbols to be decoded;

wherein the block-parallel decoding process is initiated by sending to each check node connected to a variable node a function $f(Rx_i)$ where $Rx_i$ is the received bit or symbol, i=0, 1, . . . N−1, and f(.) is a function determined at least in part by the code; and wherein the function f(.) comprises at least one of a threshold function, a linear scaling function and an approximate exponential function.

49. A method for decoding received bits or symbols, the method comprising the steps of:

applying the received bits or symbols to a set of interconnected processing nodes configured in the form of a probability dependency graph characterized at least in part by a code used to encode the bits or symbols; and implementing within the processing nodes a block-parallel decoding process for a given block of the bits or symbols to be decoded;

wherein the given block includes N bits or symbols to be decoded, and the set of interconnected processing nodes further comprises a set of N variable nodes and a set of T check nodes, with one of the N variable nodes being associated with each of the N bits or symbols to be decoded; and wherein the block-parallel decoding process is terminated when all check nodes satisfy a constraint of the code.

50. A method for decoding received bits or symbols, the method comprising the steps of:

applying the received bits or symbols to a set of interconnected processing nodes configured in the form of a probability dependency graph characterized at least in part by a code used to encode the bits or symbols; and implementing within the processing nodes a block-parallel decoding process for a given block of the bits or symbols to be decoded;

wherein the probability dependency graph comprises a directional probability dependency graph;

wherein the set of interconnected processing nodes further comprises a plurality of levels of nodes including an initial level, at least one intermediate level and a final level; and wherein the levels of nodes are configured such that the nodes in at least one intermediate level receive inputs only from nodes of a previous level and deliver outputs only to nodes of a subsequent level, such that calculations can be performed at each level without sequential intra-block dependencies.

51. The method of claim 50 wherein the initial level of nodes comprises an input node for each bit or symbol in the given block.

52. The method of claim 50 wherein outputs of the nodes of the final level give an estimate of the transmitted bits or symbols for the given block.

53. The method of claim 50 wherein outputs of the nodes of the final level give an estimate of the transmitted bits or symbols for the given block and an estimate of their associated a-posteriori probabilities or reliabilities.

54. The method of claim 50 wherein the block-parallel decoding process is initialized by providing as input to each node in the initial level a function $f(Rx_i)$ where $Rx_i$ is the received bit or symbol, $i=0, 1, \ldots N-1$, and $f(.)$ is a function determined at least in part by the code.

55. The method of claim 54 wherein the function $f(.)$ comprises at least one of a threshold function, a linear scaling function, and an approximate exponential function.

56. The method of claim 50 wherein each intermediate level of nodes calculates a function $g(.)$ of incoming values from the previous level, and passes the result of the calculation to the next level of nodes.

57. The method of claim 56 wherein the function $g(.)$ comprises at least one of a parity check function, a hyperbolic tangent function in the log domain, and a maximum function in the log domain.

58. The method of claim 50 wherein each of the levels produces an updated estimate for every bit or symbol in the given block.

59. The method of claim 50 wherein a determination as to whether a word of decoded bits or symbols is a valid codeword of the code is made using a function of inputs from a previous level to indicate convergence to a valid codeword.

60. The method of claim 50 wherein a given series of levels in the plurality of levels alternates between a variable node level and a check node level.

61. A method for decoding received bits or symbols, the method comprising the steps of:

applying the received bits or symbols to a set of interconnected processing nodes configured in the form of a probability dependency graph characterized at least in part by a code used to encode the bits or symbols; and implementing within the processing nodes a block-parallel decoding process for a given block of the bits or symbols to be decoded;

wherein a determination as to whether a word of decoded bits or symbols is a valid codeword of the code is made by determining whether designated parity constraints are satisfied.

62. A method for decoding received bits or symbols, the method comprising the steps of:

applying the received bits or symbols to a set of interconnected processing nodes configured in the form of a probability dependency graph characterized at least in part by a code used to encode the bits or symbols; and implementing within the processing nodes a block-parallel decoding process for a given block of the bits or symbols to be decoded;

wherein a determination as to whether a word of decoded bits or symbols is a valid codeword of the code is made by determining whether a product of the decoded word and a parity check matrix of the code results in the zero vector.

63. An apparatus for decoding received bits or symbols, comprising:

one or more computation units for implementing a set of nodes arranged in the form of a probability dependency graph and characterized at least in part by a code used to encode the bits or symbols, the set of nodes being configured to provide a block-parallel decoding process for a given block of the bits or symbols to be decoded;

the set of nodes comprising a plurality of check nodes and a plurality of variable nodes, each of at least a subset of the variable nodes being associated with a corresponding one of the bits or symbols to be decoded;

wherein the block-parallel decoding process includes at least one of:

(i) calculating at each of at least a subset of the check nodes a function of input from the variable nodes connected to that check node, and sending to the connected variable nodes the result of these check node calculations, wherein the check node calculations are performed in parallel; and (ii) calculating at each of at least a subset of the variable nodes a function of input from the check nodes connected to that variable node, and sending to the connected check nodes the result of these variable node calculations, wherein the variable node calculations are performed in parallel.

64. The apparatus of claim 63 wherein each of the computation units corresponds to a particular one of the nodes.

65. The apparatus of claim 63 wherein each of the computation units corresponds to multiple ones of the nodes.

66. A method for decoding received bits or symbols, the method comprising the steps of:

applying the received bits or symbols to a set of one or more computation units which implement a set of nodes arranged in the form of a probability dependency graph and characterized at least in part by a code used to encode the bits or symbols; and implementing within the nodes a block-parallel decoding process for a given block of the bits or symbols to be decoded;

the set of nodes comprising a plurality of check nodes and a plurality of variable nodes, each of at least a subset of the variable nodes being associated with a corresponding one of the bits or symbols to be decoded;

wherein the block-parallel decoding process includes at least one of:

(i) calculating at each of at least a subset of the check nodes a function of input from the variable nodes connected to that check node, and sending to the connected variable nodes the result of these check node calculations, wherein the check node calculations are performed in parallel; and (ii) calculating at each of at least a subset of the variable nodes a function of input from the check nodes connected to that variable node, and sending to the connected check nodes the result of these variable node calculations, wherein the variable node calculations are performed in parallel.

67. The method of claim 66 wherein each of the computation units corresponds to a particular one of the nodes.

68. The method of claim 66 wherein each of the computation units corresponds to multiple ones of the nodes.

* * * * *